US008700981B2

United States Patent
Krachkovsky et al.

(10) Patent No.: US 8,700,981 B2
(45) Date of Patent: Apr. 15, 2014

(54) LOW LATENCY ENUMERATION ENDEC

(75) Inventors: Victor Krachkovsky, Allentown, PA (US); Wu Chang, Santa Clara, CA (US); Razmik Karabed, San Jose, CA (US); Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 165 days.

(21) Appl. No.: 13/296,022

(22) Filed: Nov. 14, 2011

(65) Prior Publication Data

US 2013/0124950 A1    May 16, 2013

(51) Int. Cl.
*H03M 13/00*    (2006.01)

(52) U.S. Cl.
USPC .................. 714/812; 714/798; 714/758

(58) Field of Classification Search
None
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,345,342 A * | 9/1994 | Abbott et al. ............ 360/48 |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,185,173 B1 * | 2/2001 | Livingston et al. ........ 369/59.21 |
| 6,216,249 B1 | 4/2001 | Bliss |
| 6,216,251 B1 | 4/2001 | McGinn |
| 6,266,795 B1 | 7/2001 | Wei |
| 6,271,776 B1 | 8/2001 | Turk et al. |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,574,773 B1 * | 6/2003 | Turk et al. ..................... 714/792 |

(Continued)

OTHER PUBLICATIONS

Cideciyan, R.D.; Eleftheriou, E.; Marcus, B.H.; Modha, D.S., "Maximum transition run codes for generalized partial response channels," Selected Areas in Communications, IEEE Journal on , vol. 19, No. 4, pp. 619,634, Apr. 2001.*

(Continued)

*Primary Examiner* — Cynthia Britt
(74) *Attorney, Agent, or Firm* — Hamilton DeSanctis & Cha

(57) ABSTRACT

Various embodiments of the present invention provide apparatuses and methods for encoding and decoding data.

20 Claims, 5 Drawing Sheets

(56) References Cited

U.S. PATENT DOCUMENTS

| | | |
|---|---|---|
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,142,134 B2 | 11/2006 | Blaum et al. |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Vila |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2003/0102990 A1* | 6/2003 | Tsang ............................ 341/59 |
| 2008/0069373 A1 | 3/2008 | Jiang |
| 2008/0304558 A1 | 12/2008 | Zhu et al. |
| 2009/0027242 A1* | 1/2009 | Cideciyan et al. ............. 341/95 |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Immink, "A Practical Method for Approaching the Channel Capacity of Constrained Channels", IEEE Transactions on Information Theory, vol. 43, No. 5 (Sep. 1997).

Immink, "Codes for Mass Data Storage Systems", Second Edition, Shannon Foundation Publishers (2004).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"---IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tang et al., "Block Codes for a Class of Constrained Noiseless Channels", Information and Control 17, 436-461 (1970).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/269,852, Unpublished (filed Oct. 10, 2011) (Haitao Xia).

U.S. Appl. No. 13/174,453, Unpublished (filed Jun. 30, 2011) (Johnson Yen).

U.S. Appl. No. 13/113,219, Unpublished (filed May 23, 2011) (Yang Han).

U.S. Appl. No. 13/227,544, Unpublished (filed Sep. 8, 2011) (Shaohua Yang).

U.S. Appl. No. 13/283,549, Unpublished (filed Oct. 27, 2011) (Wu Chang).

U.S. Appl. No. 13/284,767, Unpublished (filed Oct. 28, 2011) (Fan Zhang).

U.S. Appl. No. 13/174,537, Unpublished (filed Jun. 30, 2011) (Anantha Raman Krishnan).

U.S. Appl. No. 13/180,495, Unpublished (filed Jul. 11, 2011) (Chung-Li Wang).

U.S. Appl. No. 13/213,751, Unpublished (filed Aug. 19, 2011) (Fan Zhang).

U.S. Appl. No. 13/227,416, Unpublished (filed Sep. 7, 2011) (Lei Chen).

(56) References Cited

OTHER PUBLICATIONS

U.S. Appl. No. 13/186,234, Unpublished (filed Jul. 19, 2011) (Haitao Xia).
U.S. Appl. No. 13/239,683, Unpublished (filed Sep. 22, 2011) (Changyou Xu).
U.S. Appl. No. 13/171,615, Unpublished (filed Jun. 29, 2011) (Bradley D. Seago).
U.S. Appl. No. 13/284,730, Unpublished (filed Oct. 28, 2011) (Fan Zhang).
U.S. Appl. No. 13/269,832, Unpublished (filed Oct. 10, 2011) (Haitao Xia).
Vasic, B., "High-Rate Girth-Eight Codes on Rectangular Integer Lattices", IEEE Trans. Communications, vol. 52, Aug. 2004, pp. 1248-52.
Vasic, B., "High-Rate Low-Density Parity-Check Codes Based on Anti-Pasch Affine Geometries," Proc ICC 2002, pp. 1332-36.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-23, Mar. 2007.
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong et al., "Design of VLSI Implementation-Oriented LDPC Codes", IEEE, pp. 670-673, 2003.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

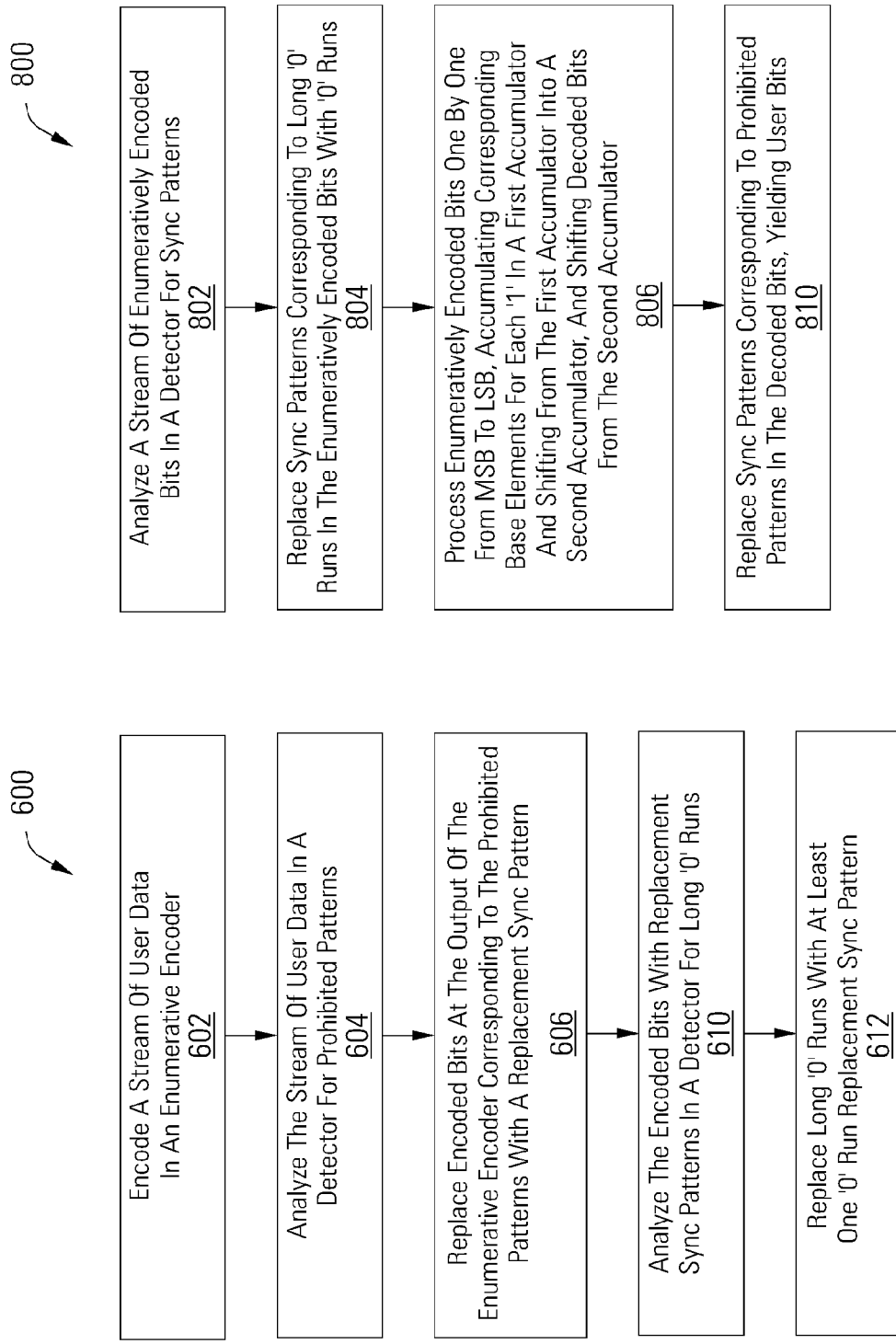

LOW LATENCY ENUMERATION ENDEC

BACKGROUND

Various products including hard disk drives utilize a read channel device to retrieve information from a medium and decode and convert the information to a digital data format. Such read channel devices may include data processing circuits including encoder and decoder circuits or endecs to encode and decode data as it is stored and retrieved from a medium or transmitted through a data channel, in order to reduce the likelihood of errors in the retrieved data. It is important that the read channel devices be able to rapidly and accurately decode the original stored data patterns in retrieved or received data samples.

Typically, data is encoded and stored or transmitted from most significant bit (MSB) to least significant bit (LSB), and decoded in the opposite order. Because the data is decoded in the reverse order from the encoding and the retrieval or reception, data is buffered before the decoding process begins. This introduces a long latency, particularly when the block of data being encoded and decoded is long.

Thus, for at least the aforementioned reason, there exists a need in the art for reducing latency in data processing circuits.

BRIEF SUMMARY

Various embodiments of the present invention provide apparatuses and methods for encoding and decoding data. For example, a storage system is disclosed that includes a storage system with a storage medium maintaining a data set, a read/write head assembly operable to write the data set to the storage medium and to read the data set from the storage medium, a maximum transition run encoder operable to encode the data set before it is written to the storage medium and a decoder operable to decode the data set after it is read from the storage medium. The encoder includes a prohibited pattern detector, an enumeration encoder, and a prohibited pattern replacement circuit. The prohibited pattern detector is operable to detect a prohibited bit pattern in a stream of data bits from the data set. The enumeration encoder is operable to encode the stream of data bits using a change of base in a representation of the stream of data bits with periodic bases and to constrain an encoded output to a maximum transition run to yield an encoded stream of data bits. The prohibited pattern replacement circuit is operable to replace a block of bits in the encoded data bits corresponding to at least a portion of the prohibited bit pattern in the stream of data bits with a sync pattern to yield a second encoded stream of data bits as an output of the encoder. The decoder includes a sync pattern detector, an enumeration decoder and a sync pattern replacement circuit. The sync pattern detector is operable to detect the sync pattern in a retrieved encoded stream of data bits from the data set. The enumeration decoder is operable to decode the retrieved encoded stream of data bits in a same bit significance direction as the encoded stream of data bits was encoded to yield a decoded stream of data bits. The sync pattern replacement circuit is operable to replace a block of bits in the decoded stream of data bits corresponding to the sync pattern in the encoded stream of data bits to yield a second decoded stream of data bits as the decoder output.

In some embodiments of the storage system, the encoder also includes a long zero run detector operable to detect a run of zeros exceeding a zero run limit in the second encoded stream of data bits, and a long zero run replacement circuit operable to replace the run of zeros in the second encoded stream of data bits with a second sync pattern to yield a third encoded stream of data bits.

In some embodiments of the storage system, the sync pattern detector is operable to detect the second sync pattern in the encoded stream of data bits. The decoder also includes a second sync pattern replacement circuit operable to replace the second sync pattern in the retrieved encoded stream of data bits with a long zero run to yield a second encoded stream of data bits. The enumeration decoder is operable to decode the second encoded stream of data bits derived from the retrieved encoded stream of data bits.

In some embodiments of the storage system, the decoder also includes a base elements memory operable to supply enumeration base elements used to encode the encoded stream of data bits, a first accumulator and shifter circuit operable to accumulate the enumeration base elements, a second accumulator and shifter circuit operable to accumulate and shift an output from the first accumulator and shifter circuit to yield the decoded stream of data bits, and a multiplexer operable to provide the enumeration base elements from the base elements memory and zero values to the first accumulator and shifter circuit. In some instances, the base elements memory is operable to index the enumeration base elements based on a position of individual bits shifted in from the second encoded stream of data bits.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 6 depicts a flow diagram showing a method for encoding data in accordance with various embodiments of the present invention;

FIG. 8 depicts a flow diagram showing a method for decoding data in accordance with various embodiments of the present invention;

DETAILED DESCRIPTION OF THE INVENTION

Various embodiments of the present invention are related to apparatuses and methods for encoding and decoding data, and more particularly to encoding and decoding data in the same order to reduce latency. An enumerative or enumeration encoder and corresponding decoder are disclosed that enable that very rate-efficient coding solutions, while decoding in the same direction as the encoding, from MSB to LSB, to avoid the latency resulting from storing the entire codeword on either the encoding or decoding side. Thus, only finite latency is required to encode and decode for any codeword size. To prevent carry-overs from LSB to MSB in the decoder, the encoder and decoder include carryover cancellation, using pattern replacements in the encoder and replaced pattern restoration in the decoder.

Figure 1:
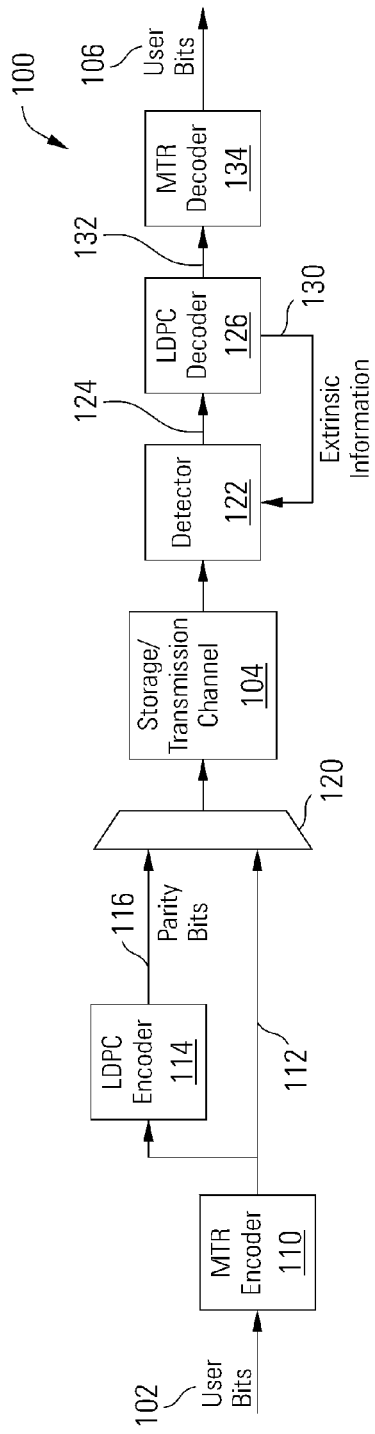
FIG. 1 depicts a block diagram of a read channel which may be used to store and retrieve or transmit and receive data in accordance with various embodiments of the present invention.

Although the encoder and decoder disclosed herein are not limited to any particular application, they may be used for example in a read channel of a storage device. Turning to FIG. 1, a read channel 100 is used to process user data bits 102, store them in or transit them through a storage or transmission channel 104 and retrieve the user data bits 106 without introducing errors. The user data bits 102 are processed in an MTR encoder 110, implemented as an enumerative encoder that supports the Maximum Transition Run (MTR) constraint. The frequency response of the read channel 100 is generally at a maximum at DC and degrades near the Nyquist frequency, particularly when the storage or transmission channel 104 is a magnetic storage device. By limiting the maximum transition run length in the encoded user bits 112, the read channel 100 operates below the Nyquist frequency and avoids errors that might be introduced by the degraded frequency response near the Nyquist frequency. The MTR encoder 110 also replaces patterns in the encoded user bits 112 that would lead to carry-overs when decoding the encoded user bits 112, supporting decoding from MSB to LSB. In addition, the MTR encoder 110 also replaces long zero run patterns in the encoded bits that would cause degraded behavior of control loops at the decoder side.

The encoded user bits 112 are provided to a low density parity check (LDPC) encoder 114, which produces parity bits 116 for the encoded user bits 112. The parity bits 116 are combined with the encoded user bits 112 in a multiplexer 120, and the resulting data is stored in or transmitted through storage or transmission channel 104.

The data retrieved or received from the storage or transmission channel 104 and is processed in a detector 122. Additional components may be included as is known before and after the storage or transmission channel 104. For example, if the storage or transmission channel 104 is a magnetic hard disk drive, an analog front end may be included to amplify and filter an analog signal from the magnetic hard disk drive, followed by an analog to digital converter to sample the analog signal and provide a digital bit stream. Filtering components may also be included, such as a digital finite impulse response filter, to filter the signal to the detector 122.

The detector 122 may be any detector circuit known in the art including, but not limited to, a Viterbi algorithm detector circuit or a maximum a posteriori detector circuit. Based upon the disclosure provided herein, one of ordinary skill in the art will recognize a variety of detector circuits that may be used in relation to different embodiments of the present invention. Detector circuit 122 performs a data detection process on the received input from the storage or transmission channel 104 resulting in a detected output 124. The detected output 124 is provided to a decoder such as an LDPC decoder 126 which performs parity checks on the detected output 124, ensuring that parity constraints established by the LDPC encoder 114 are satisfied in order to detect and correct any errors that may have occurred in the data while passing through the storage or transmission channel 104 or other components of the read channel 100. Other error detection and correction encoders and decoders may be used in the read channel 100 in place of the LDPC encoder 114 and LDPC decoder 126, and one of ordinary skill in the art will recognize a variety of error detection and correction encoders and decoders that may be used in relation to different embodiments of the present invention. In the case of the LDPC encoder 114 and LDPC decoder 126, the detector 122 and LDPC decoder 126 may operate in an iterative fashion, with extrinsic information 130 passed from the LDPC decoder 126 to the detector 122 to aid in the data detection and parity check process. The LDPC decoder 126 yields encoded user bits 132 retrieved from the storage or transmission channel 104, with the parity bits removed after the combination of encoded user bits and parity bits satisfy the parity check constraints.

The encoded user bits 132 from the LDPC decoder 126 are provided to an MTR decoder 134 which reverses the enumerative encoding performed by the MTR encoder 110. In particular, the MTR decoder 134 decodes the encoded user bits 132 in the same order as the MTR encoder 110 encodes the user data bits 102, from MSB to LSB, greatly reducing the latency of decoding large blocks of data. The MTR decoder 134 yields user data bits 106, which should be identical to user data bits 102 if the data is not corrupted in the storage or transmission channel 104 beyond the capacity of the detector 122 and LDPC decoder 126 to correct.

Figure 2:
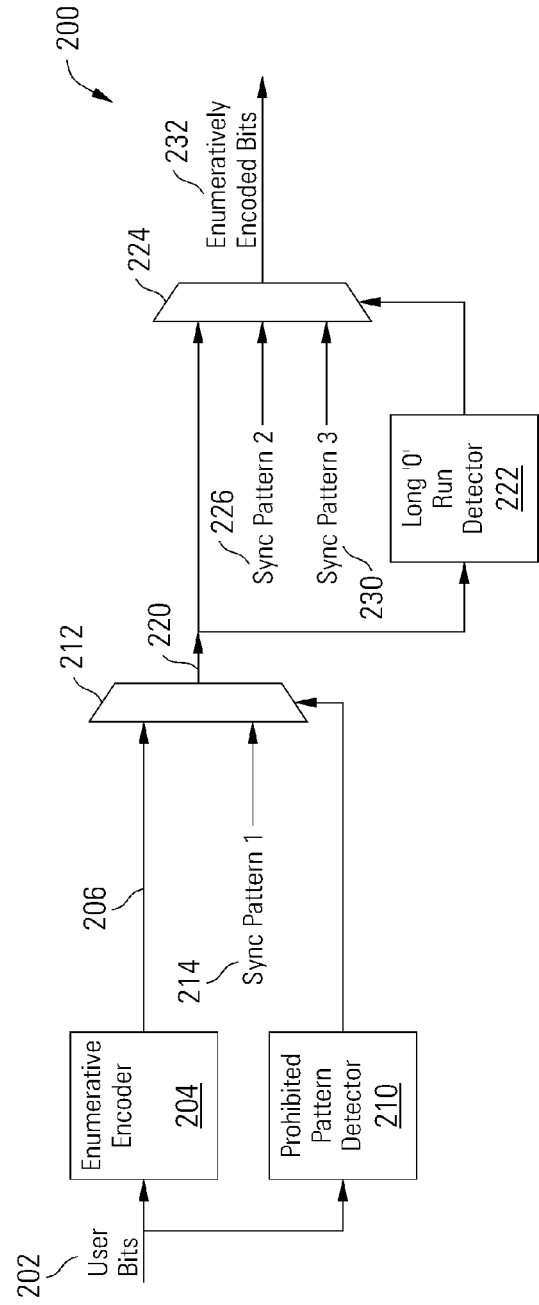
FIG. 2 depicts a block diagram of an encoder suitable for use in a read channel in accordance with various embodiments of the present invention.
Figure 3:
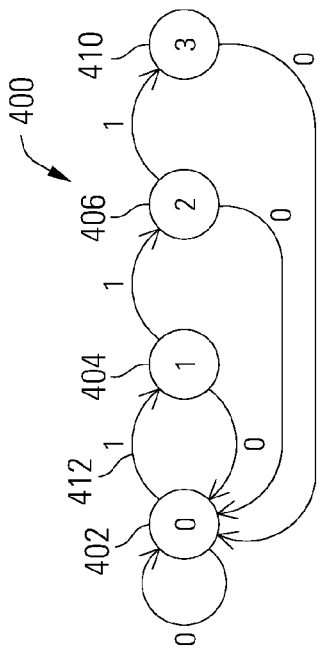
FIG. 3 depicts a trellis diagram illustrating state changes in user data bits.

Turning to FIG. 2, an MTR encoder 200 is illustrated in accordance with some embodiments of the invention and which may be suitable for use, along with other embodiments, as the MTR encoder 110 of FIG. 1. The MTR encoder 200 may be adapted to limit the maximum transition run-length to any run-length, such as three. The maximum transition run-length is also referred to as a j-constraint, with the output of an MTR(j) encoder constrained such that the maximum transition run-length in the output sequence does not exceed j transitions in the non-return to zero (NRZ) domain, or correspondingly, j "1"s in the non-return to zero inverted (NRZI) domain. Thus, the output of an MTR(3) encoder should not exceed 3 transitions in a row. This is illustrated in the trellis diagram 300 of FIG. 3, in which states correspond to NRZ bit values, and transitions between states correspond to NRZI transition values. The trellis diagram 300 is applicable to any data bits, such as the user bits 202 at the input to an enumerative encoder 204 or encoded bits at an output 206 of the enumerative encoder 204 in FIG. 2. The trellis diagram 300 of FIG. 3 is a two-state trellis, with three consecutive data bit transitions illustrated. A series of three transitions 302, 304 and 306 illustrate the alternating states generated by a one, one, one sequence in the NRZI domain, which would be the maximum allowable transition run-length in an MTR(3) encoder and which would be prohibited in an MTR(2) encoder.

In the NRZ domain, data bits are represented by physical electrical states, such as a high voltage for a '1' and a low voltage for a '0'. In the NRZI domain, transitions in data bits are represented by the physical electrical state, such as a high voltage for a transition or a changing bit value and a low voltage for no transition or a constant bit value. Thus, a '1' in the NRZI domain indicates that the associated bit value in the NRZ domain transitions either from '0' to '1' or from '1' to '0', and a '0' in the NRZI domain indicates that the associated bit value in the NRZ domain stays constant at either a '0' or a '1'.

Figure 4:
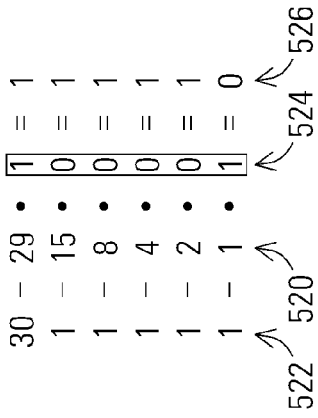
FIG. 4 depicts a finite state transition diagram (FSTD) for a maximum transition run (MTR) of three.

Turning to FIG. 4, the limited transitions of an MTR(3) encoder may also be illustrated by a finite state transition diagram (FSTD) 400, which illustrates transitions in the NRZI domain. The FSTD 400 includes four states 402, 404, 406, and 410. A '1' in the NRZI domain causes a transition (e.g., 412) from one state (e.g., 402) to the next (e.g., 404). When in state 402, a '0' transitions back to state 402 and a '1' transitions to state 404. When in state 404, a '0' transitions back to state 402 and a '1' transitions to state 406. When in state 406, a '0' transitions back to state 402 and a '1' transitions to state 410. Because of the j-constraint of the MTR(3) encoder, a '1' transition when in state 410 is forbidden. Thus, an MTR(3) encoder is limited to three consecutive transitions in the NRZ domain or '1' values in the NRZI domain.

The Shannon capacity $\lambda$ or information rate of an MTR(j) constrained encoder is defined as $\lambda = \lim_{n \to \infty} \log_2(B(n))/n$, where $B(n)$ is the number of MTR(j)-constrained sequences of length n. For large n, $B(n) \sim 2^{n\lambda}$. For MTR(j), $B(n)$ can be derived as a set of Fibonacci numbers, numbers defined as sums of preceding numbers in the series. For example, for MTR(3), the respective sequence of Fibonacci numbers is defined by the recurrence $B(n)=B(n-1)+B(n-2)+B(n-3)+B(n-4)$. This recurrence is also illustrated in FIG. 4, where the loop of length "k" that begins and ends at zero state corresponding to recurrence term $B(n-k)$. For example, the loop of length 3 passing through states 0,1,2 corresponds to the term $B(n-3)$ in this Fibonacci recursion. By substituting $B(n)-2^{n\lambda}$, where ~ means asymptotic equality up to some constant factor, and $\lambda$ denotes the constraint capacity, we get from Fibonacci recursion the following equation: $2^{4\lambda}=2^{3\lambda}, +2^{2\lambda}, +2^{\lambda}+1$, giving capacity $\lambda$ of about 0.946777 for MTR(3) modulation encoding.

The enumerative encoder 204 in MTR encoder 200 uses encoding with limited periodic basis, with encoding rate approaching the capacity of MTR(3) constraint, while enabling a decoder to decode the encoded data from the enumerative encoder 204 from MSB to LSB, reducing latency. Enumerative decoding refers to a change of base in the representation of the same integer. Although examples of periodic basis are disclosed herein for the enumerative encoding, the enumerative encoder and decoder are not limited to any particular numeric basis for encoding.

Before moving to the periodic basis used in some embodiments of the enumerative encoder 204, encoding with a Fibonacci series will be described to illustrate how the j-constraint, which prevents transition runs of length >j, is supported, using example of j=3 constraint in the MTR(3) encoder case. In enumerative encoding of Fibonacci numbers, the enumerative encoding is a change of base from binary representation to binary Fibonacci representation according to Equation 1:

$$A = \sum_{i=1}^{K} x(i) \cdot 2^{K-i} = \sum_{i=1}^{N} y(i) \cdot B(N-i) \qquad \text{Equation 1}$$

where $x(i), y(i) = \{0,1\}$, and $B(N-i)$ are Fibonacci weights.

When used in binary representations, Fibonacci weights have some redundant states, but they provide a unique way to encode into the constrained sequence to prevent long runs of '1's. Thus, by precoding user data to the NRZI domain and using enumerative encoding that applies a j-constraint to prevent long runs of '1's, excessive runs of transitions in the NRZ domain are prevented, and the system avoids the Nyquist region of operation with its degraded frequency response. For any j-constraint, a Fibonacci series is derived from constraint graph connections, similar to that in the example of the MTR (3)-constraint and the graph of FIG. 4. For example, the series of Fibonacci weights or Fibonacci basis for the MTR(3) constraint may be $B(1)=1; B(2)=2; B(3)=4; B(4)=8; B(n)=B(n-1)+B(n-2)+B(n-3)+B(n-4)$ for n>4. Thus, $B(n)=\{1, 2, 4, 8, 15, 29, 56, 108 \ldots\}$. In contrast, the binary weights for a binary sequence are $B(n)=\{1, 2, 4, 8, 16, 42, 64, 128 \ldots\}$, which form a basis in binary representation.

Figure 5A:
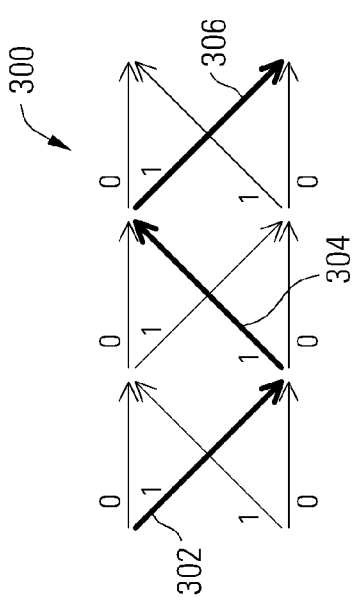
FIGS. 5A and 5B depict an example process of encoding the decimal number 30 into a binary representation and a binary Fibonacci representation.

The process of encoding the decimal number 30 into the binary system (binary weight) representation is illustrated in FIG. 5A. A column of base elements 500 is used as divisors for the input column 502. Because the initial input 30 is divisible by the largest shown base element 16, a 1 is produced at the top of the output column 504. When base element 16 is subtracted from input 30, a remainder of 14 is left at the top of the remainder column 506. The remainder 14 is divisible by the next base element 8 and leaves a remainder of 6. Remainder 6 is divisible by the next base element 4 and leaves a remainder of 2. Remainder 2 is divisible by the next base element 2 and leaves a remainder of 0. Remainder 0 is not divisible by the next base element 1, so base element 1 is multiplied by 0 before subtracting from the remainder 0. The encoded output of the decimal input 30 is '11110' in binary representation, if represented in binary basis. In the NRZI domain, this produces a run of four transitions, which is prohibited in the MTR(3) encoder. Notably, the encoding process is performed in MSB to LSB order 510.

Figure 5B:
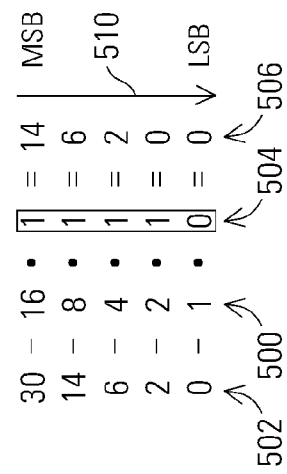

In contrast, the process of encoding the decimal number 30 into a binary Fibonacci representation is illustrated in FIG. 5B. A column of Fibonacci base elements 520 is used as divisors for the input column 522. Because the initial input 30 is divisible by the largest shown base element 29, a 1 is produced at the top of the output column 524. When base element 29 is subtracted from input 30, a remainder of 1 is left at the top of the remainder column 526. The remainder 1 is not divisible by any of the following 4 bases, 15, 8, 4 and 2, resulting in 4 successive '0's in the output column 524. The remainder 1 is divisible by the last base element 1, leaving a remainder of 0. The encoded output of the decimal input 30 is '100001' in binary Fibonacci representation with the bases listed above. In the NRZI domain, this produces no runs of transitions.

The number of bases used in the enumerative encoding may be any of a variety of suitable candidates. In some embodiments, the enumerative encoder 204 implements a 17/18 code using 18 8-bit elements B(n), with one modulation bit position at n=0, according to Table 1:

TABLE 1

| n | B(n) | n | B(n) | n | B(n) |
|---|------|---|------|---|------|
| 0 | 0 × FC | 6 | 0 × C8 | 12 | 0 × 9F |
| 1 | 0 × F3 | 7 | 0 × C1 | 13 | 0 × 99 |
| 2 | 0 × E9 | 8 | 0 × B9 | 14 | 0 × 93 |

TABLE 1-continued

| n | B(n) | n | B(n) | n | B(n) |
|---|------|---|------|---|------|
| 3 | 0 × E1 | 9  | 0 × B2 | 15 | 0 × 8D |
| 4 | 0 × D8 | 10 | 0 × AB | 16 | 0 × 88 |
| 5 | 0 × D0 | 11 | 0 × A5 | 17 | 0 × 83 |

The variable n denotes a periodic index for periodic sequence B(n), which is incremented or decremented modulo 18. The order of n is in reverse, such that if y(0), y(1), . . . y(N−1) is the encoder output sequence, then B(n_ini), B(n_ini−1), . . . B(0) are the corresponding weights or bases used to determine the y-values, and n_ini=N−1 modulo 18.

In some embodiments of the enumerative encoder 204, a state variable S is an s+1=9-bit integer. Base elements are used in reverse order compared to Fibonacci enumeration, with the highest basis element coming first. To initialize the encoding process, s input bits x(k) are fed into the state variable, after which input bits x(k) are shifted in while generating output bits y(n) and subtracting the base elements from the state S, as shown in the following example pseudo-code:

```
Initialization (0 ≤ k < s):
    S ← (S << 1) | x(k)
Recursion (0≤n<N):
    y(n) = (S ≥ B(N − n − 1))          Generate output bit
    S ← (S − y(n) ·B(N − n − 1))       Subtraction of base element from
                                        state
    if (k ≤ K) & (Δ(N − n − 1) == 0)
        S ← (S << 1) | x(k)            State shift, update with input bit
        k = k + 1
    endif
```

The first user block is 16 bits, one shorter than the regular 17-bit block. After feeding a user sector to the encoder, the encoding trellis tail is terminated or flushed by feeding 9 or 8 zeros to the encoder input, where only 8 bits are needed in the case when the last bit of the encoded sector is a modulation bit. At the sector start, the encoder does not need to know the sector size, and at sector end, the encoder terminates the sector without a need for padding bits.

The 17/18 code has a very small rate gap to constraint capacity: $\lambda_{MTR(3)} - \lambda_{17/18}$. The 17/18 code thus approaches the capacity rate of MTR(3). Because of this gap, there are some sequences which satisfy MTR(3) constraints but which never occur in the 17/18 code. These sequences may be used as sync patterns in the encoded data to replace encoded data sequences that would cause carry-overs, enabling the enumerative encoder 204 to use a finite length accumulator regardless of encoder data size. This enables the decoder to decode the encoded data in the same bit significance direction as the encoder, from MBS to LSB, eliminating the latency of storing the encoded data before beginning the decoding process. Other code rates p/q≤λ (λ-constraint capacity) may be used. For any such code the output dimension N is calculated from the input dimension K as N=K+ceil(q*K/p), but this formula may be adjusted based on implementation-specific details. For example, for 17/18 code, due to periodic base implementation a more accurate expression N=K+ceil(K−16)/17)+1 is achieved.

Turning again to FIG. 2, a prohibited pattern detector 210 is used to detect a bit pattern in the user bits 202 that will cause a long carry-over in the enumerative decoder (700, FIG. 7) beyond the accumulator/shifter length. In the 17/18 encoder, the prohibited pattern detector 210 detects the presence of prohibited bit pattern '1000000000000000000000000000 . . . ' (27 or more zeros, or 28 or more zeros after the preceding prohibited bit pattern)". When the prohibited pattern detector 210 detects the presence of the prohibited bit pattern at the user bits 202, it causes a multiplexer 212 to replace the bits at the output 206 of the enumerative encoder 204 corresponding to the prohibited bit pattern or to a portion of the prohibited bit pattern with a first sync pattern 214. The sync pattern may be any of the bit sequences that satisfy the MTR(3) constraint but which never occur in the 17/18 code, based upon the bases selected to implement the code, such as those in Table 1. For example, the sync pattern may be the shortest of these bit patterns. If a twenty-bit first sync pattern is selected (twenty is the maximal pattern length that can be used with twenty-eight bit accumulator/shifter length), the most significant twenty bits of the encoded bits corresponding to the prohibited bit pattern are replaced at the output 206 of enumerative encoder 204. Because the replacement sync patterns are themselves MTR(3) compliant, the output 220 from the multiplexer 212 is also MTR(3) compliant. By selecting replacement sync patterns that begin and end with '0', the replacement patterns are also are also compliant with MTR(3) constraints when combined with adjacent bits.

A similar replacement mechanism may be included to implement a k-constraint, preventing long runs of 0's of length k in the NRZI domain at the output of the MTR encoder (e.g., 110). A long '0' run detector 222 detects runs of '0' in the output 220. In some embodiments, the long '0' run detector 222 is adapted to detect a run of 16 zeros, and to cause a multiplexer 224 to replace the run of '0's with one of two replacement sync patterns 226 and 230, depending on the prefix of three bits immediately preceding the detected run of '0's. Two such replacement sync patterns 226 and 230 are 0x7776 when the prefix is not equal to '111' and 0x3BBA when the prefix equals '111'. The patterns are selected to provide good synchronization properties for the resulting data, to prevent false detection of other patterns. The enumerative encoding in the enumerative encoder 204, the prohibited pattern replacement in the prohibited pattern detector 210 and multiplexer 212 and the long '0' run replacement in the long '0' run detector 222 and multiplexer 224 yields enumeratively encoded bits 232 that may be decoded in the same order as encoding, from MSB to LSB.

Turning to FIG. 6, a flow diagram 600 shows a method for encoding data in accordance with some embodiments of the present invention. Following flow diagram 600, a stream of user data is encoded in an enumerative encoder. (Block 602) For example, the user data may be encoded using a 17/18 code rate encoder with an MTR(3) constraint. The stream of user data is analyzed in a detector for instances of prohibited patterns which would cause carry-over. (Block 604) In some embodiments, the detector detects the presence of the 28-bit pattern '1000000000000000000000000000', if it is the leader, or '0000000000000000000000000000', if it is following another such pattern, in the user data before the enumerative encoder. The method also includes replacing encoded bits at the output of the enumerative encoder corresponding to the prohibited patterns with a replacement sync pattern. (Block 606) The encoded bits with replacement sync patterns are analyzed in a detector for long '0' runs. (Block 610) Long '0' runs are replaced with at least one replacement sync pattern. (Block 612) The resulting enumeratively encoded bits satisfy j and k restraints and are suitable for decoding in the same order as they are encoded, e.g., MSB to LSB.

Figure 7:
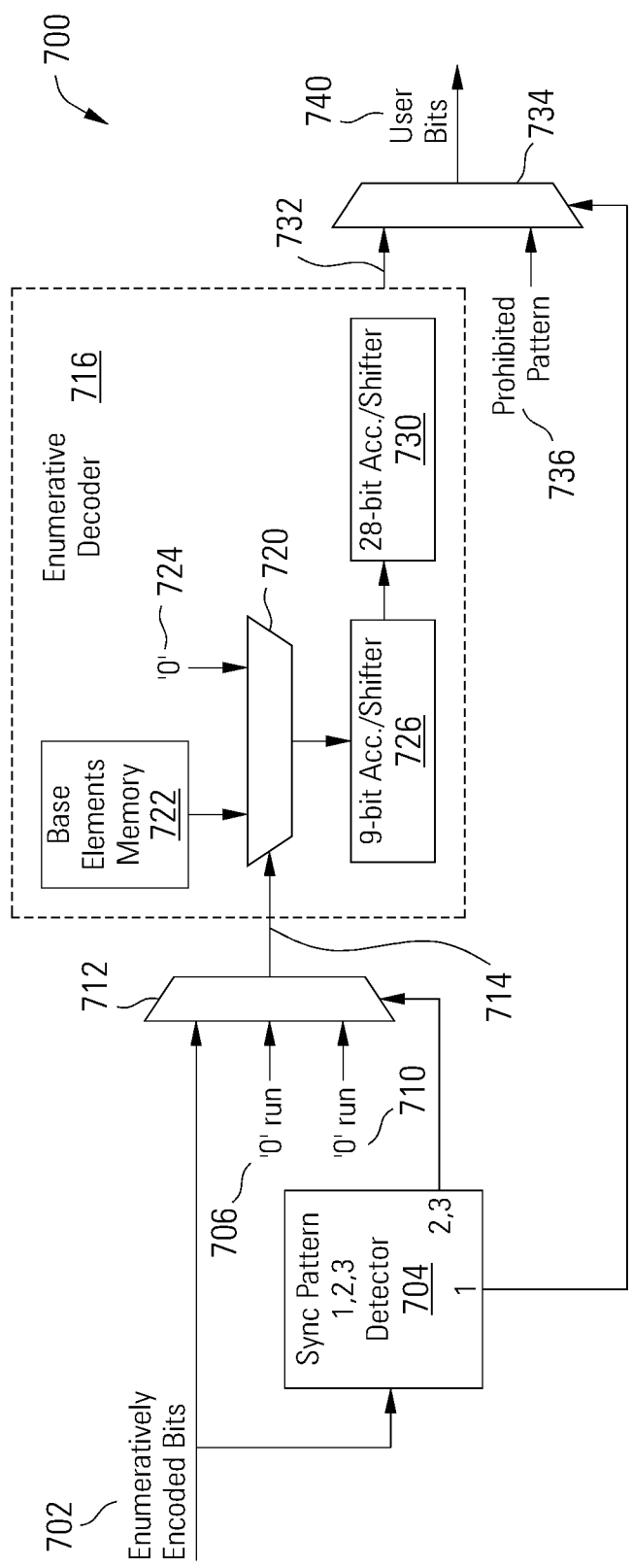
FIG. 7 depicts a block diagram of a decoder suitable for use in a read channel in accordance with various embodiments of the present invention.

Turning to FIG. 7, an MTR decoder 700 is illustrated in accordance with some embodiments of the invention and which may be suitable for use, along with other embodiments, as the MTR decoder 134 of FIG. 1. The MTR decoder 700 may be used to decode enumeratively encoded bits 702 in the same order in which they were encoded, for example, MSB to LSB, without buffering all of the enumeratively encoded bits before decoding. A sync pattern detector 704 detects the presence of the sync pattern used to replace prohibited patterns (sync pattern 1) and the two sync patterns that were used to replace long '0' runs in the encoded data (sync patterns 2 and 3) inserted in the enumeratively encoded bits 702 by the MTR encoder 200. If either the second or third sync patterns are detected, the original '0' runs 706 and 710 are restored to the enumeratively encoded bits 702 by multiplexer 712 in place of the sync patterns. Notably, the sync pattern detector 704 may be a unitary circuit or multiple circuits for performing the functions disclosed herein. Even when performed in multiple circuits, the multiple circuits are referred to herein as a sync pattern detector 704.

The resulting encoded bits 714 are provided to an enumerative decoder 716 for decoding. Depending on the value of the input bit from encoded bits 714, '1' or '0', a multiplexer 720 provides either a base element from a base element memory 722 or a '0' value 724 to be added to previous values in a 9-bit accumulator/shifter 726. Base element memory 722 contains the base elements of Table 1, and tracks the bit position of the incoming bit from the encoded bits 714. For each bit received, the base element index is updated, and when a modulation bit is received, the base element index is restarted. As each input bit is received, if it is a '1', the appropriate base element from the base element memory 722 is provided to the 9-bit accumulator 726 by multiplexer 720. The base element is added to the existing number in the 9-bit accumulator 726, accumulating for y(n)='1' values. If the input bit from the encoded bits 714 is a '0', the multiplexer 720 provides a '0' to the 9-bit accumulator 726, and the 9-bit accumulator 726 does not accumulate or shift, while the index to the base elements in the base element memory 722 is updated. A '0' at the encoded bits 714 may also be referred to as a gap that is used to normalize the periodic base elements.

When the 9-bit accumulator 726 accumulates or adds a base element from the multiplexer 720 in response to a '1' input bit, if the MSB in the 9-bit accumulator 726 is flipped or changed, the flip is carried to a 28-bit accumulator/shifter 730 by adding +1 to the LSB in the 28-bit accumulator 730. Both the 9-bit accumulator 726 and the 28-bit accumulator 730 are then left-shifted, causing the next MSB from the 9-bit accumulator 726 to be shifted into the 28-bit accumulator 730. The output 732 of the 28-bit accumulator 730 (and of the enumerative decoder 716) contains decoded user bits with prohibited patterns replaced by sync pattern 1 (e.g., 214). The sync pattern detector 704 will have detected sync pattern 1 in the enumeratively encoded bits 702, and causes a multiplexer 734 to replace the sync pattern 1 in the output 732 with the prohibited pattern 736, yielding user bits 740.

Turning to FIG. 8, a flow diagram 800 shows a method for decoding data in accordance with some embodiments of the present invention. Following flow diagram 800, a stream of enumeratively encoded bits are analyzed in a detector for sync patterns. (Block 802) Sync patterns corresponding to long '0' runs are replaced in the enumeratively encoded bits with '0' runs. (Block 804) Enumeratively encoded bits are processed one by one from MSB to LSB, accumulating corresponding base elements for each '1' in a first accumulator and shifting from the first accumulator into a second accumulator, and shifting decoded bits from the second accumulator. (Block 806) Sync patterns corresponding to prohibited patterns are replaced in the decoded bits, yielding user bits. (Block 810) In some embodiments, in locations of sync patterns the decoded bits are obtained by decoding sync patterns, hence they can contain random errors. However, as far as the sync pattern locations, these incorrectly decoded bits can be replaced by the prohibited patterns.

The MTR encoder 200 and MTR decoder 700 form a low latency enumeration endec that does not require buffering of encoded or decoded data, while applying j-constraints and k-constraints for maximum transition runs and maximum '0' runs.

Figure 9:
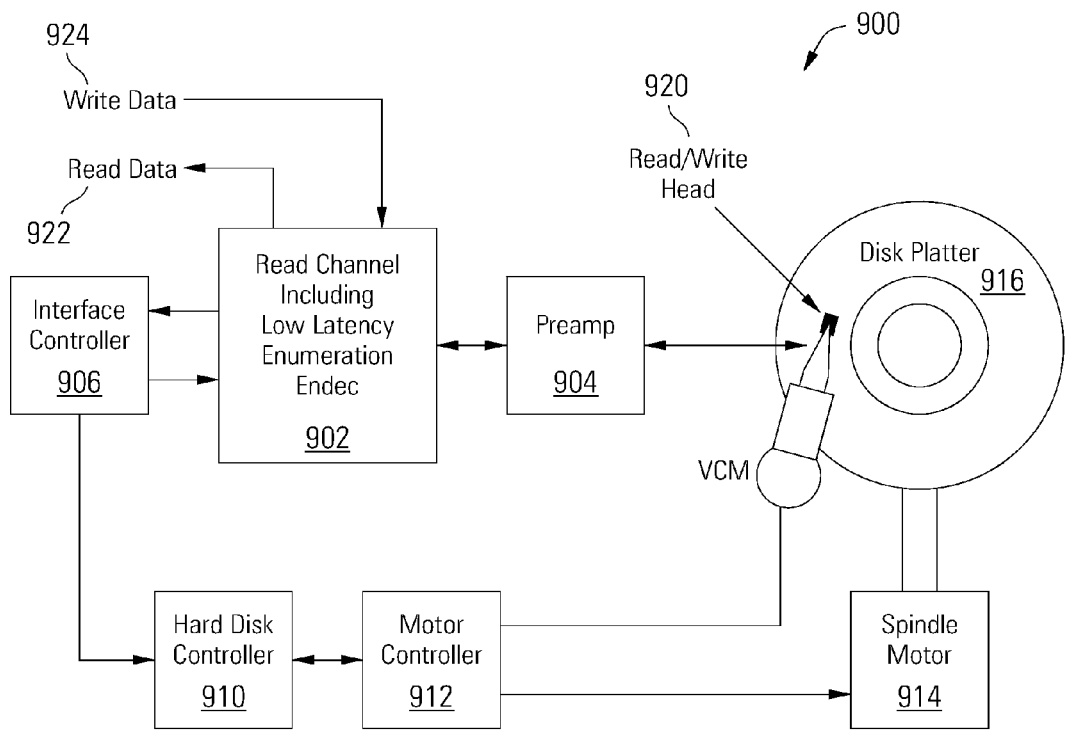
FIG. 9 depicts a storage system including an encoder and decoder in accordance with some embodiments of the present invention.
Figure 10:
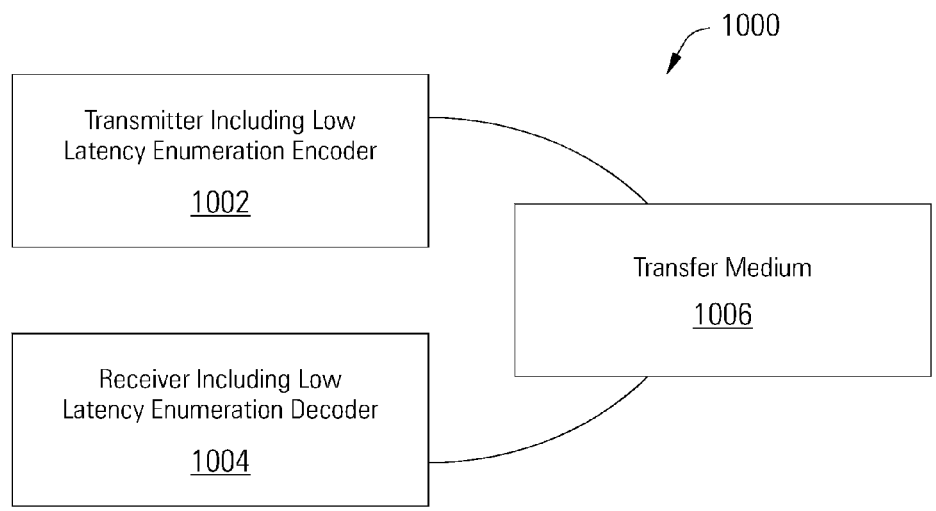
FIG. 10 depicts a wireless communication system including an encoder and decoder in accordance with some embodiments of the present invention.

Although the low latency enumeration endec disclosed herein is not limited to any particular application, several examples of applications are presented in FIGS. 9 and 10 that benefit from embodiments of the present invention. Turning to FIG. 9, a storage system 900 is illustrated as an example application of a low latency enumeration endec in accordance with some embodiments of the present invention. The storage system 900 includes a read channel circuit 902 with a low latency enumeration endec in accordance with some embodiments of the present invention. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. As part of encoding information prior to storing and decoding the received information, read channel circuit 902 processes the received signal using a low latency enumeration endec, including an enumeration encoder and decoder. Such a low latency enumeration endec may be implemented consistent with that disclosed above in relation to FIGS. 2 and 7. In some cases, the encoding and decoding may be performed consistent with the flow diagrams disclosed above in relation to FIGS. 6 and 8. A write operation is substantially the opposite of the preceding read operation with write data 924 being provided to read channel circuit 902. This data is then encoded using an enumeration encoder such as that of FIG. 2 and written to disk platter 916.

It should be noted that storage system 900 may be integrated into a larger storage system such as, for example, a RAID (redundant array of inexpensive disks or redundant array of independent disks) based storage system. It should also be noted that various functions or blocks of storage system 900 may be implemented in either software or firmware, while other functions or blocks are implemented in hardware.

Turning to FIG. 10, a wireless communication system 1000 or data transmission device including a transmitter 1002 and receiver 1004 with a low latency enumeration endec is shown in accordance with some embodiments of the present invention. Communication system 1000 includes a transmitter 1002 that is operable to transmit encoded information via a transfer medium 1006 as is known in the art. The encoded data is received from transfer medium 1006 by receiver 1004. Transmitter 1002 and receiver 804 incorporate a low latency enumeration endec. Such a low latency enumeration endec may be implemented consistent with that described above in relation to FIGS. 2 and 7. In some cases, the encoding and decoding may be done consistent with the flow diagrams discussed above in relation to FIGS. 6 and 8.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for encoding and decoding data in a low latency enumeration endec. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A storage system comprising:
a storage medium operable to maintain a data set;
a read/write head assembly operable to write the data set to the storage medium and to read the data set from the storage medium;
a maximum transition run encoder operable to encode the data set before it is written to the storage medium and comprising:
a prohibited pattern detector operable to detect a prohibited bit pattern in a stream of data bits from the data set;
an enumeration encoder operable to encode the stream of data bits using a change of base in a representation of the stream of data bits with periodic bases and to constrain an encoded output to a maximum transition run to yield an encoded stream of data bits; and
a prohibited pattern replacement circuit operable to replace a block of bits in the encoded data bits corresponding to at least a portion of the prohibited bit pattern in the stream of data bits with a first sync pattern to yield a second encoded stream of data bits; and
a decoder operable to decode the data set after it is read from the storage medium and comprising:
a sync pattern detector operable to detect the first sync pattern in a retrieved encoded stream of data bits from the data set;
an enumeration decoder operable to decode the retrieved encoded stream of data bits in a same bit significance direction as the encoded stream of data bits was encoded to yield a decoded stream of data bits; and
a sync pattern replacement circuit operable to replace a block of bits in the decoded stream of data bits corresponding to the first sync pattern in the encoded stream of data bits to yield a second decoded stream of data bits.

2. The storage system of claim 1, wherein the encoder further comprises:
a long zero run detector operable to detect a run of zeros exceeding a zero run limit in the second encoded stream of data bits; and
a long zero run replacement circuit operable to replace the run of zeros in the second encoded stream of data bits with a second sync pattern to yield a third encoded stream of data bits.

3. The storage system of claim 2, wherein the sync pattern detector is further operable to detect the second sync pattern in the encoded stream of data bits, wherein the decoder further comprises a second sync pattern replacement circuit operable to replace the second sync pattern in the retrieved encoded stream of data bits with a long zero run to yield the second encoded stream of data bits, and wherein the enumeration decoder is operable to decode the second encoded stream of data bits derived from the retrieved encoded stream of data bits.

4. The storage system of claim 3, wherein the decoder comprises:
a base elements memory operable to supply enumeration base elements used to encode the encoded stream of data bits;
a first accumulator and shifter circuit operable to accumulate the enumeration base elements;
a second accumulator and shifter circuit operable to accumulate and shift an output from the first accumulator and shifter circuit to yield the decoded stream of data bits; and
a multiplexer operable to provide the enumeration base elements from the base elements memory and zero values to the first accumulator and shifter circuit.

5. The storage system of claim 4, wherein the base elements memory is operable to index the enumeration base elements based on a position of individual bits shifted in from the second encoded stream of data bits.

6. An encoder comprising:
a prohibited pattern detector operable to detect a prohibited bit pattern in a stream of data bits;
an enumeration encoder operable to encode the stream of data bits using a change of base in the representation of the stream of data bits with periodic bases and to constrain an encoded output to a maximum transition run to yield an encoded stream of data bits; and
a prohibited pattern replacement circuit operable to replace a block of bits in the encoded data bits corresponding to at least a portion of the prohibited bit pattern in the stream of data bits with a sync pattern to yield a second encoded stream of data bits.

7. The encoder of claim 6, further comprising:
   a long zero run detector operable to detect a run of zeros exceeding a zero run limit in the second encoded stream of data bits; and
   a long zero run replacement circuit operable to replace the run of zeros in the second encoded stream of data bits with a second sync pattern to yield a third encoded stream of data bits.

8. The encoder of claim 7, wherein the long zero run detector is further operable to analyze a prefix of bits to the run of zeros, and wherein the long zero run replacement circuit is operable to replace the run of zeros in the second encoded stream of data bits with either the second sync pattern or a third sync pattern based on a value of the prefix of bits.

9. The encoder of claim 7, wherein the prohibited pattern detector, the enumeration encoder, the prohibited pattern replacement circuit, the long zero run detector and the long zero run replacement circuit are implemented as an integrated circuit.

10. The encoder of claim 7, wherein the prohibited pattern detector, the enumeration encoder, the prohibited pattern replacement circuit, the long zero run detector and the long zero run replacement circuit are incorporated in a storage device.

11. The encoder of claim 7, wherein the prohibited pattern detector, the enumeration encoder, the prohibited pattern replacement circuit, the long zero run detector and the long zero run replacement circuit are incorporated in a data transmission device.

12. The encoder of claim 6, wherein the enumeration encoder comprises a 17/18 rate code encoder.

13. A decoder comprising:
   a sync pattern detector operable to detect a first sync pattern and a second sync pattern in an encoded stream of data bits, wherein the first sync pattern is a replacement for a prohibited pattern, and wherein the second sync pattern is a replacement for a long zero run;
   a first sync pattern replacement circuit operable to replace the second sync pattern in the encoded stream of data bits with a long zero run to yield a second encoded stream of data bits;
   an enumeration decoder operable to decode the second encoded stream of data bits in a same bit significance direction as the encoded stream of data bits was encoded to yield a decoded stream of data bits; and
   a second sync pattern replacement circuit operable to replace a block of bits in the decoded stream of data bits corresponding to the first sync pattern in the encoded stream of data bits to yield a second decoded stream of data bits.

14. The decoder of claim 13, wherein the enumeration decoder comprises:
   a base elements memory operable to supply enumeration base elements used to encode the encoded stream of data bits;
   a first accumulator and shifter circuit operable to accumulate the enumeration base elements;
   a second accumulator and shifter circuit operable to accumulate and shift an output from the first accumulator and shifter circuit to yield the decoded stream of data bits; and
   a multiplexer operable to provide the enumeration base elements from the base elements memory and zero values to the first accumulator and shifter circuit.

15. The decoder of claim 14, wherein the base elements memory is operable to index the enumeration base elements based on a position of individual bits shifted in from the second encoded stream of data bits.

16. The decoder of claim 15, wherein the multiplexer is operable to provide one of the enumeration base elements to the first accumulator when a one is shifted in from the second encoded stream of data bits.

17. The decoder of claim 16, wherein the first accumulator and shifter circuit and the second accumulator and shifter circuit are operable to add 1 to a least significant bit in the second accumulator and shifter circuit when a most significant bit in the first accumulator and shifter circuit is flipped.

18. The decoder of claim 13, wherein the sync pattern detector, the first sync pattern replacement circuit, the enumeration decoder and the second sync pattern replacement circuit are implemented as an integrated circuit.

19. The decoder of claim 13, wherein the sync pattern detector, the first sync pattern replacement circuit, the enumeration decoder and the second sync pattern replacement circuit are incorporated in a storage device.

20. The decoder of claim 13, wherein the sync pattern detector, the first sync pattern replacement circuit, the enumeration decoder and the second sync pattern replacement circuit are incorporated in a data transmission device.

* * * * *